US011894202B1

(12) United States Patent
Wu et al.

(10) Patent No.: US 11,894,202 B1
(45) Date of Patent: Feb. 6, 2024

(54) KEYPAD STRUCTURE AND VISUAL PROGRAMMABLE INTELLIGENT CONTROLLER WITH KEYPAD STRUCTURE

(71) Applicant: SHENZHEN XINZENGCAI CREATIVE ELECTRONICS CO., LTD., Shenzhen (CN)

(72) Inventors: Jingshui Wu, Shenzhen (CN); Feiliang Wu, Shenzhen (CN)

( * ) Notice: Subject to any disclaimer, the term of this patent is extended or adjusted under 35 U.S.C. 154(b) by 0 days.

(21) Appl. No.: 18/465,607

(22) Filed: Sep. 12, 2023

(30) Foreign Application Priority Data

Sep. 4, 2023 (CN) .......................... 202322405876.1

(51) Int. Cl.
  *H01H 13/70* (2006.01)
  *H01H 13/705* (2006.01)
  *G06F 3/02* (2006.01)
  *H05K 5/00* (2006.01)
(52) U.S. Cl.
  CPC ......... *H01H 13/705* (2013.01); *G06F 3/0202* (2013.01); *H05K 5/0018* (2022.08)
(58) Field of Classification Search
  None
  See application file for complete search history.

(56) References Cited

U.S. PATENT DOCUMENTS

| | | | | |
|---|---|---|---|---|
| 9,245,702 | B1* | 1/2016 | Rollet | G06F 21/86 |
| 10,936,087 | B2* | 3/2021 | Stoops | H01H 13/702 |
| 11,447,013 | B2* | 9/2022 | Mirandola | B60K 37/06 |
| 2015/0008111 | A1* | 1/2015 | Grenfell | G07F 7/0886 |
| | | | | 200/5 A |
| 2015/0077330 | A1* | 3/2015 | Okabe | G06F 3/023 |
| | | | | 345/156 |
| 2016/0139678 | A1* | 5/2016 | Ang | G06F 21/83 |
| | | | | 341/24 |
| 2016/0378199 | A1* | 12/2016 | Sizelove | G06F 3/0202 |
| | | | | 235/449 |
| 2017/0139493 | A1* | 5/2017 | Hong | G06F 3/0383 |
| 2018/0151940 | A1* | 5/2018 | Jacquemont | G07G 1/0018 |
| 2019/0278951 | A1* | 9/2019 | Hershman | G06F 21/83 |
| 2019/0286247 | A1* | 9/2019 | Barel | G06F 3/044 |
| 2020/0266013 | A1* | 8/2020 | Schraeder | G06F 21/86 |
| 2020/0402741 | A1* | 12/2020 | Huang | H01H 13/703 |
| 2022/0226570 | A1* | 7/2022 | Dieckman | F21V 23/04 |

* cited by examiner

*Primary Examiner* — Xanthia C Relford

(57) ABSTRACT

The present disclosure discloses a keypad structure and a visual programmable intelligent controller with a keypad structure, including at least one light-transmittable key, at least one key mounting shell for arranging each key, an elastic element arranged, at an edge of the key and configured to allow the key to move up and down in a reciprocating manner, at least one display device, wherein an image displayed by the display device is watched via the key and a circuit body arranged between the key and the display device to sense an action of the key.

20 Claims, 6 Drawing Sheets

KEYPAD STRUCTURE AND VISUAL PROGRAMMABLE INTELLIGENT CONTROLLER WITH KEYPAD STRUCTURE

CROSS-REFERENCE TO RELATED APPLICATIONS

The application claims priority of Chinese patent application CN2023224058761 filed on 2023 Sep. 4, which is incorporated herein by reference in its entireties.

TECHNICAL FIELD

The present disclosure relates to the field of scene decoration, and in particular, to a keypad structure and a visual programmable intelligent controller with a keypad structure.

BACKGROUND

In order to facilitate users to type or input accounts or passwords on various electronic devices, there are various different types of existing keypad structures, mainly including a plurality of buttons, a plurality of elastic elements (for example, scissors switches), and a keypad base plate. Each elastic element is arranged between each key and the keypad baseplate, and each key forms a pressing portion. The keypad baseplate has a plurality of conduction points corresponding to the respective pressing portions, and the conduction points maintain distances from each other through elastic devices. Therefore, when a certain key is pressed, a pressing member will move, and its corresponding elastic device will come into contact with the conduction point to achieve an inputting purpose. However, when a key is improperly pressed or an elastic device is damaged, the key will tilt in one direction and cannot move normally, causing no normal contact with the conduction point and inability to input any content.

In addition, with the continuous development and progress of society, the live streaming industry has rapidly risen. During live streaming, live streaming pictures and application programs to be used often need to be switched, so that a live streamer needs to complete a series of complicated operations using a mouse and a keypad to complete switching, which affects the experience of the live streamer.

Therefore, there is an urgent need to provide a keypad structure and a visual programmable intelligent controller with a keypad structure on the market, so that users can quickly and smoothly perform switching between live streaming pictures and application programs by one click through the visual programmable intelligent controller with the keypad structure.

SUMMARY

In order to overcome the shortcomings of the prior art, the present disclosure provides a keypad structure, including at least one circuit body, wherein the circuit board includes at least one flexible first sheet body; at least one first circuit layer, wherein the first circuit layer is arranged on the first sheet body; at least one second sheet body; at least one second circuit layer, wherein the second circuit layer is arranged on the second sheet body; and several insulation protruding points, wherein the several insulation protruding points are arranged between the first sheet body and the second sheet body, and the insulation protruding points are arranged around the first circuit layer and the second circuit layer to reserve a gap between the first circuit layer and the second circuit layer, so that the first circuit layer and the second circuit layer are in selective contact.

As the improvement of the present disclosure, at least one insulation region is arranged on the first sheet body and/or the second sheet body, and the insulation region is arranged around the first circuit layer and the second circuit layer.

As the improvement of the present disclosure, the at least one circuit body includes a plurality of circuit bodies spaced apart from each other; the first circuit layers of two adjacent circuit bodies are separated by the insulation region; and the second circuit layers of two adjacent circuit bodies are separated by the insulation region.

As the improvement of the present disclosure, a colloid is arranged on the insulation region, and the first sheet body and the second sheet body are connected through the colloid.

As the improvement of the present disclosure, the colloid is configured to reserve a gap between the first circuit layer and the second circuit layer, so that the first circuit layer and the second circuit layer are in selective contact.

As the improvement of the present disclosure, one side of the first sheet body has a first inner surface, and the other side of the first sheet body has a first outer surface; one side of the second sheet body has a second inner surface facing the first inner surface, and the other side of the second sheet body is provided with a second outer surface; the first circuit layer is arranged on the first inner surface; the second circuit layer is arranged on the second inner surface; the insulation protruding points are arranged between the first inner surface and the second inner surface; and the insulation region is arranged on the first inner surface and/or the second inner surface.

As the improvement of the present disclosure, the first sheet body is light-transmittable, and the second sheet body is light-transmittable.

As the improvement of the present disclosure, the keypad structure further includes a light-transmittable key arranged in a manner of facing the first outer surface; the light-transmittable key includes at least one light-transmitting body; at least one pressing portion is arranged at an edge of the light-transmitting body; the pressing portion is located above the first circuit layer and the second circuit layer; at least one elastic element is arranged between the light-transmitting body and the first outer surface; and the elastic element is arranged at a periphery of the pressing portion.

As the improvement of the present disclosure, the at least one elastic element includes a plurality of elastic elements; the at least one light-transmitting body includes a plurality of light-transmitting bodies; the at least one pressing portion includes a plurality of pressing portions; the at least one first circuit layer includes a plurality of first circuit layers; the at least one second circuit layer includes a plurality of second circuit layers; the plurality of elastic elements are respectively arrayed between the first outer surfaces of the plurality of light-transmitting bodies, and are arranged at peripheries of the pressing portions; and the plurality of pressing portions are respectively arrayed above the plurality of first circuit layers and the plurality of second circuit layers.

As the improvement of the present disclosure, the keypad structure further includes a display device; the display device is arranged in a manner of facing the second outer surface; and an image displayed by the display device is watched through the first sheet body and the second sheet body via the key.

As the improvement of the present disclosure, the first circuit layer is electroplated on the first inner surface of the first sheet body, and the second circuit layer is electroplated on the second inner surface of the second sheet body.

As the improvement of the present disclosure, both the first circuit layer and the second circuit layer are conductive indium tin.

As the improvement of the present disclosure, the second sheet body is rigid.

As the improvement of the present disclosure, the second sheet body is a light-transmittable glass sheet body; the first sheet is a light-transmittable resin sheet body; and the insulation protruding points are resin insulation protruding points.

As the improvement of the present disclosure, the several insulation protruding points are uniformly arrayed on the second sheet body, and a distance between two adjacent insulation protruding points is 3 mm to 6 mm.

As the improvement of the present disclosure, a height of each insulation protruding point is at least 0.03 mm.

The present disclosure also provides a visual programmable intelligent controller with a keypad structure, including at least one light-transmittable key; at least one key mounting shell for arranging each key; an elastic element, arranged at an edge of the key and configured to allow the key to move up and down in a reciprocating manner; at least one display device, wherein an image displayed by the display device is watched via the key; a circuit body, arranged between the key and the display device to sense an action of the key, wherein the circuit board includes: at least one flexible light-transmittable first sheet body; at least one first circuit layer, wherein the first circuit layer is arranged on the first sheet body; at least one light-transmittable second sheet body; at least one second circuit layer, wherein the second circuit layer is arranged on the second sheet body; and several insulation protruding points, wherein the several insulation protruding points are arranged between the first sheet body and the second sheet body, and the insulation protruding points are arranged around the first circuit layer and the second circuit layer to reserve a gap between the first circuit layer and the second circuit layer, so that the first circuit layer and the second circuit layer are in selective contact.

As the improvement of the present disclosure, the circuit body for sensing the action of the key is in point connection to the display device to form a touch-control panel.

As the improvement of the present disclosure, the display device includes at least one information display portion.

As the improvement of the present disclosure, at least one pressing portion is arranged at an edge of the key; the pressing portion is located above the first circuit layer and the second circuit layer; and the elastic element is located at a periphery of the pressing portion.

Beneficial effects: the present disclosure discloses a keypad structure and a visual programmable intelligent controller with a keypad structure, including at least one light-transmittable key; at least one key mounting shell for arranging each key; an elastic element, arranged at an edge of the key and configured to allow the key to move up and down in a reciprocating manner; at least one display device, wherein an image displayed by the display device is watched via the key; a circuit body, arranged between the key and the display device to sense an action of the key, the circuit body includes: at least one flexible light-transmittable first sheet body; at least one first circuit layer, wherein the first circuit layer is arranged on the first sheet body; at least one second light-transmittable sheet body; at least one second circuit layer, wherein the second circuit layer is arranged on the second sheet body; and several insulation protruding points, wherein the several insulation protruding points are arranged between the first sheet body and the second sheet body, and the insulation protruding points are arranged around the first circuit layer and the second circuit layer to reserve a gap between the first circuit layer and the second circuit layer, so that the first circuit layer and the second circuit layer are in selective contact. A user can press the first sheet body through a key, so as to push the first sheet body towards the second sheet body, and the insulation protruding points have a slight elastic deformation to eliminate the gap between the first circuit layer and the second circuit layer and cause the first circuit layer and the second circuit layer to be in contact with each other and switched on. The first circuit layer and the second circuit layer of the circuit body are in contact with each other and switched on to sense whether the key is clicked and triggered, so as to complete a control operation performed on the key. Furthermore, a content displayed by a display device can be controlled through a program. For example, icons displayed by the display device are controlled, and the icons displayed by the display device are then matched with application programs in a terminal device such as a computer and a mobile phone. The icons displayed by the display device can be observed by the user through the first sheet body and the second sheet body via the key. The user can selectively click the key according to an observed icon to switch a picture displayed in a mobile terminal into a content corresponding to the icon, so as to achieve one-key control and switching of contents in live streaming pictures. Moreover, after the switching is completed, an elastic element can drive the key to be reset to relieve the pressure of the key on the first sheet body, so that the insulation protruding points can have a slight elastic resetting deformation to reserve the gap between the first circuit layer and the second circuit layer, completing the resetting of the key. Compared with a traditional key, the key is pressed and reset more smoothly, has high stability, and is difficult to damage and skew. The user can quickly and smoothly complete switching of live streaming pictures and switching of application programs by using the visual programmable intelligent controller with the keypad structure. For example, the icons displayed by the display device can include icons of QQ and WeChat. When the user intends to switch a live streaming picture displayed in the mobile terminal to QQ or WeChat, the user can find out the corresponding key for displaying the icon of QQ or WeChat. The user clicks the key for displaying the icon of QQ or WeChat to cause the key for displaying the icon of QQ or WeChat to push the first sheet body corresponding to the key, so that the insulation protruding points at the first sheet body corresponding to the key have a slight elastic deformation to eliminate the gap between the first circuit layer and second circuit layer corresponding to the key, so that the first circuit layer and second circuit layer corresponding to the key are in contact with each other and switched on, so as to complete the control operation performed on the key and switch a live streaming picture and an application program to QQ or WeChat.

BRIEF DESCRIPTION OF THE DRAWINGS

In order to explain the technical solutions of the embodiments of the present disclosure more clearly, the following will briefly introduce the accompanying drawings used in the embodiments. Apparently, the drawings in the following description are only some embodiments of the present disclosure. Those of ordinary skill in the art can obtain other drawings based on these drawings without creative work.

The present disclosure is further described below in detail in combination with the accompanying drawings and embodiments.

DETAILED DESCRIPTION OF THE EMBODIMENTS

Embodiment I

Figure 1:
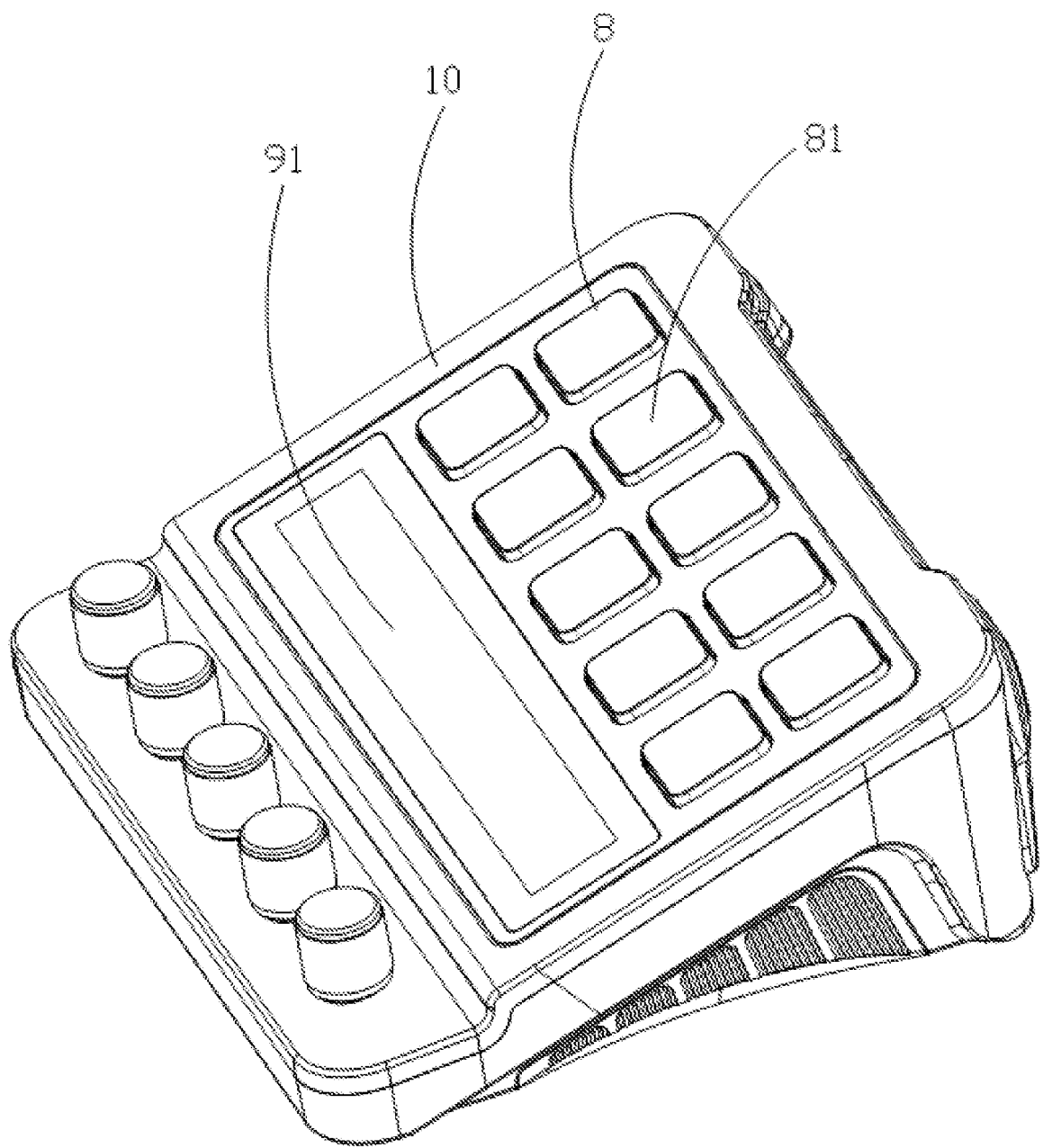
FIG. 1 is a schematic diagram of an overall structure of the present disclosure.
Figure 2:
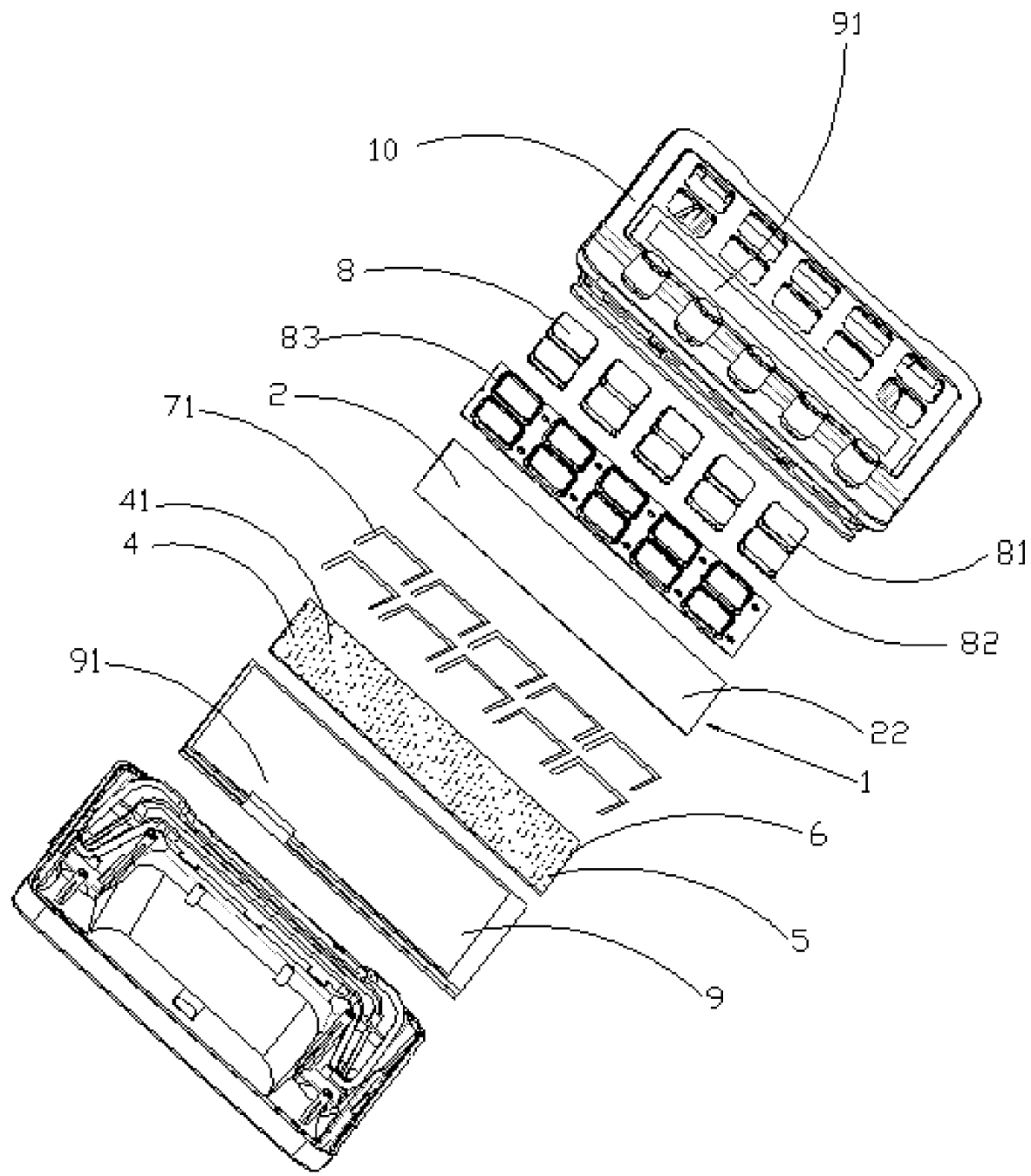
FIG. 2 is an exploded diagram of the present disclosure.
Figure 3:
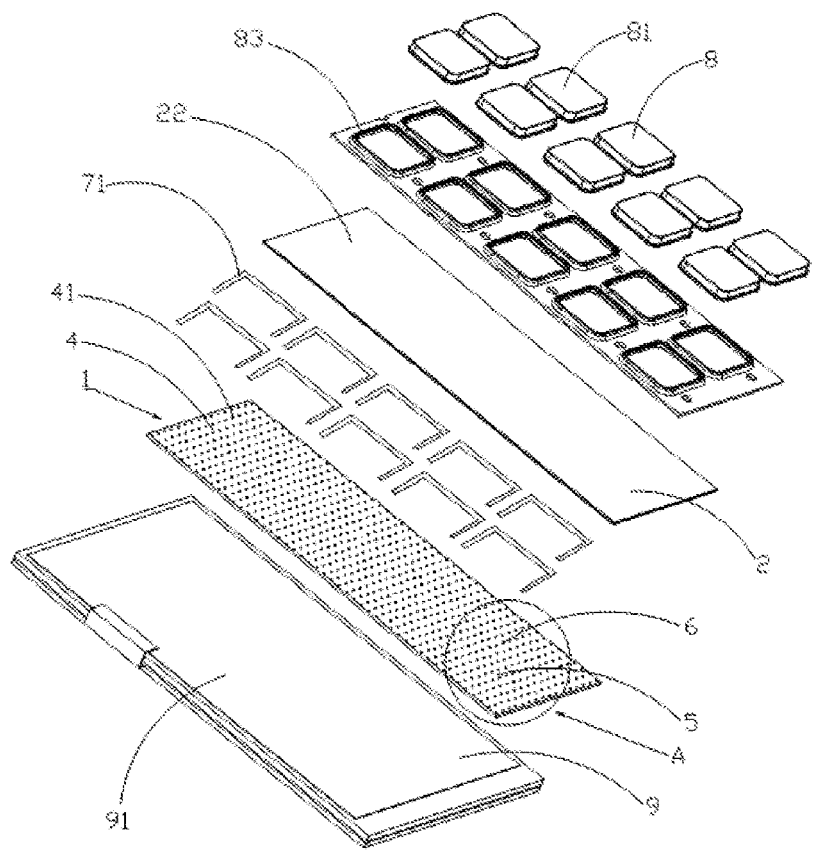
FIG. 3 is an exploded diagram of a circuit body of the present disclosure.
Figure 4:
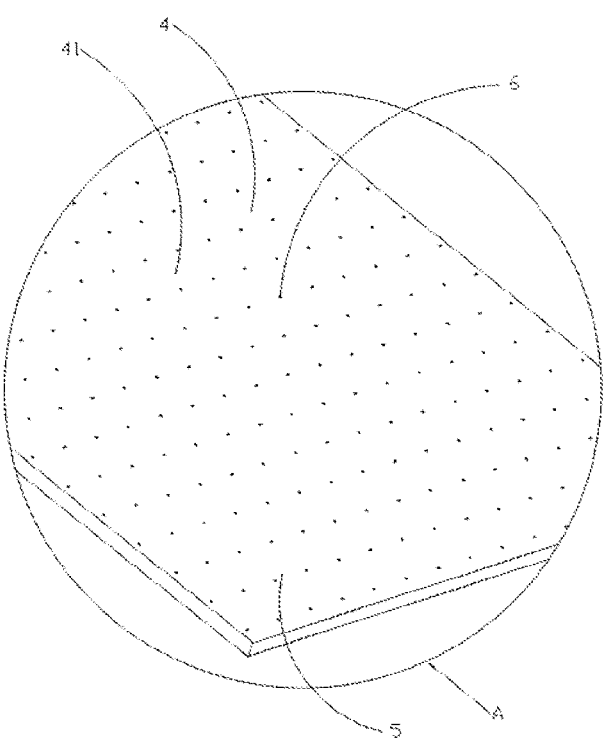
FIG. 4 is an enlarged diagram of the part A of FIG. 3.
Figure 5:
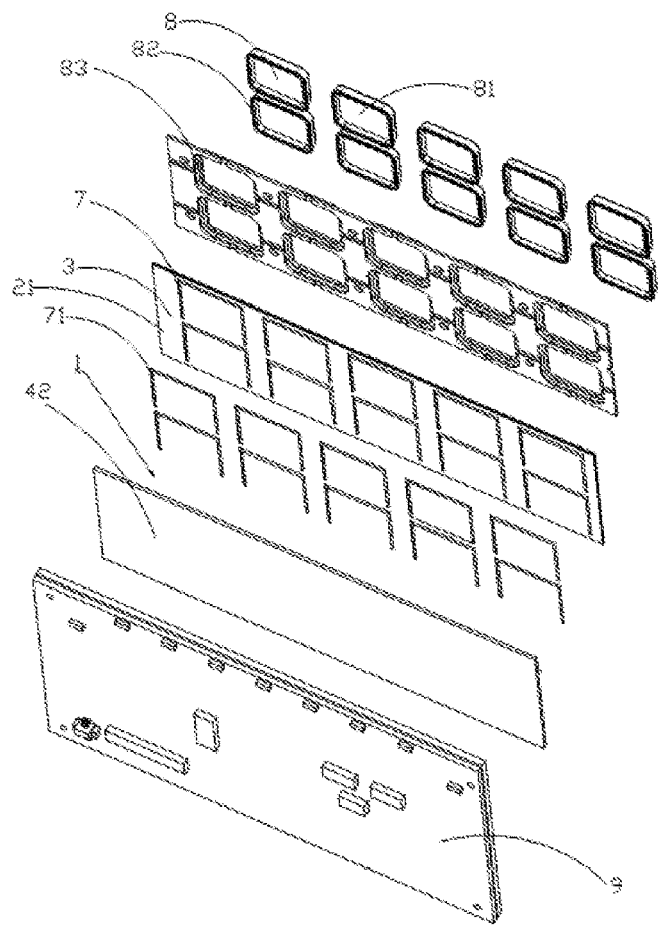
FIG. 5 is another exploded diagram of a circuit body of the present disclosure.
Figure 6:
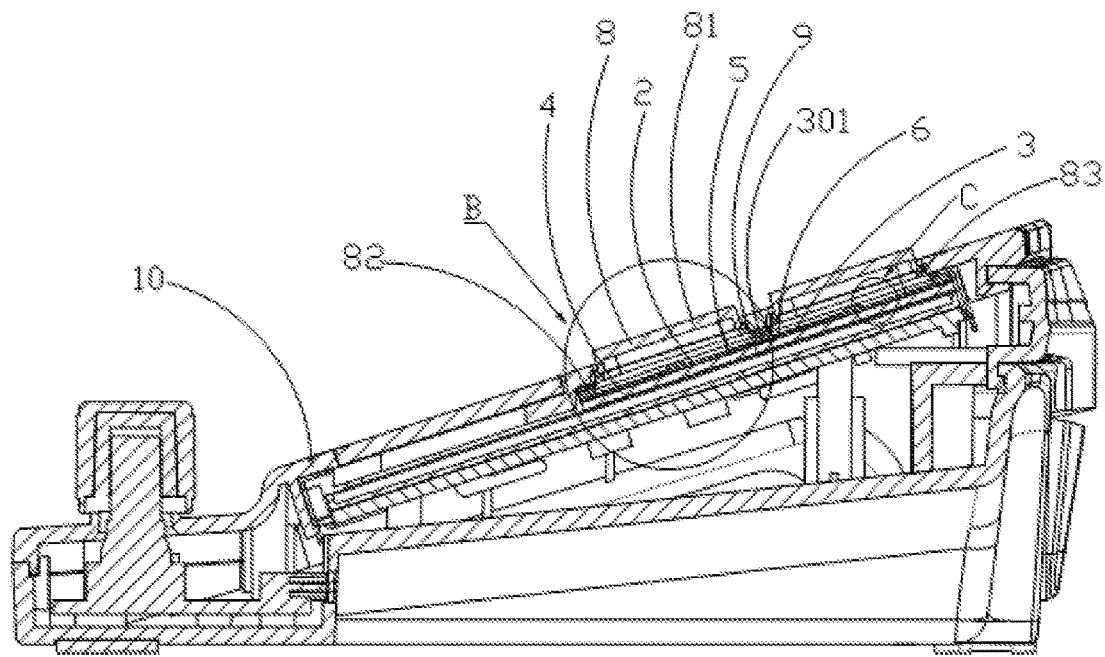
FIG. 6 is a cut-away view obtained by sectioning along a circuit board.
Figure 7:
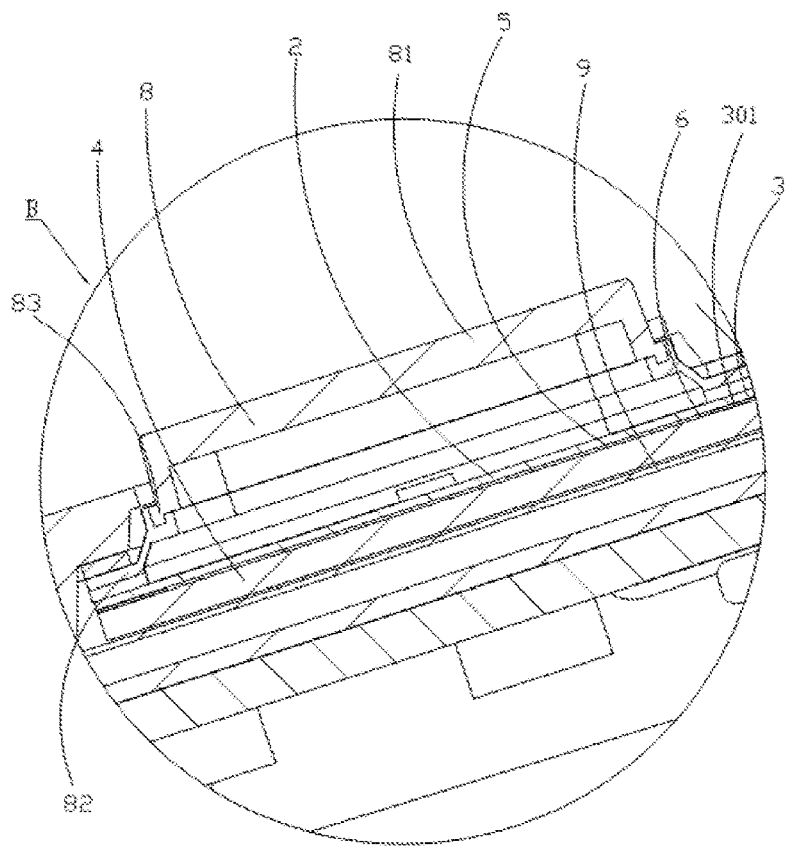
FIG. 7 is an enlarged diagram of the part B of FIG. 6.
Figure 8:
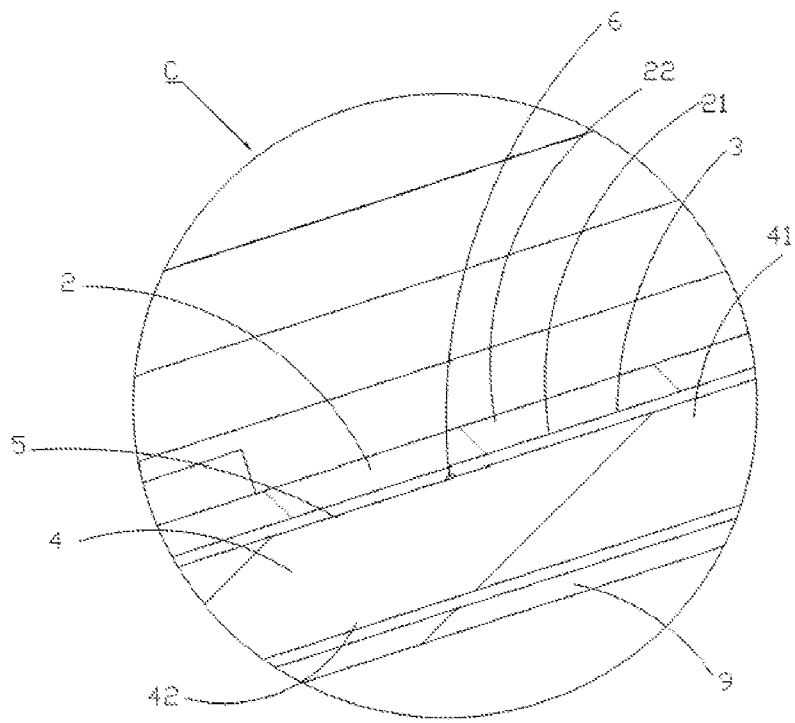
FIG. 8 is an enlarged diagram of C of FIG. 6.

Referring to FIG. 1 to FIG. 10, a keypad structure includes at least one circuit body 1, wherein the circuit body 1 includes:

at least one flexible first sheet body 2;

at least one first circuit layer 3, wherein the first circuit layer 3 is arranged on the first sheet body 2;

at least one second sheet body 4;

at least one second circuit layer 5, wherein the second circuit layer 5 is arranged on the second sheet body 4; and several insulation protruding points 6, wherein the several insulation protruding points 6 are arranged between the first sheet body 2 and the second sheet body 4, and the insulation protruding points 6 are arranged around the first circuit layer 3 and the second circuit layer 5 to reserve a gap 301 between the first circuit layer 3 and the second circuit layer 5, so that the first circuit layer 3 and the second circuit layer 5 are in selective contact.

Due to the above structure, a user can press the first sheet body 2 through a key 8, so as to push the first sheet body 2 towards the second sheet body 4, and the insulation protruding points 6 have a slight elastic deformation to eliminate the gap 301 between the first circuit layer 3 and the second circuit layer 5 and cause the first circuit layer 3 and the second circuit layer 5 to be in contact with each other and switched on. The first circuit layer 3 and the second circuit layer 5 of the circuit body 1 are in contact with each other and switched on to sense whether the key 8 is clicked and triggered, so as to complete a control operation performed on the key 8. Furthermore, a content displayed by a display device 9 can be controlled through a program. For example, icons displayed by the display device 9 are controlled, and the icons displayed by the display device 9 are then matched with application programs in a terminal device such as a computer and a mobile phone. The icons displayed by the display device 9 can be observed by the user through the first sheet body 2 and the second sheet body 4 via the key 8. The user can selectively click the key 8 according to an observed icon to switch a picture displayed in a mobile terminal into a content corresponding to the icon, so as to achieve one-key control and switching of contents in live streaming pictures. Moreover, after the switching is completed, an elastic element 83 can drive the key 8 to be reset to relieve the pressure of the key 8 on the first sheet body 2, so that the insulation protruding points 6 can have a slight elastic resetting deformation to reserve the gap 301 between the first circuit layer 3 and the second circuit layer 5, completing the resetting of the key 8. Compared with a traditional key, the key 8 is pressed and reset more smoothly, has high stability, and is difficult to damage and skew. The user can quickly and smoothly complete switching of live streaming pictures and switching of application programs by using the visual programmable intelligent controller with the keypad structure. For example, the icons displayed by the display device 9 can include icons of QQ and WeChat. When the user intends to switch a live streaming picture displayed in the mobile terminal to QQ or WeChat, the user can find out the corresponding key 8 for displaying the icon of QQ or WeChat. The user clicks the key 8 for displaying the icon of QQ or WeChat to cause the key 8 for displaying the icon of QQ or WeChat to push the first sheet body 2 corresponding to the key 8, so that the insulation protruding points 6 at the first sheet body 2 corresponding to the key 8 have a slight elastic deformation to eliminate the gap 301 between the first circuit layer 3 and second circuit layer 5 corresponding to the key 8, so that the first circuit layer 3 and second circuit layer 5 corresponding to the key 8 are in contact with each other and switched on, so as to complete the control operation performed on the key 8 and switch a live streaming picture and an application program to QQ or WeChat.

In this embodiment, at least one insulation region 7 is arranged on the first sheet body 2 and/or the second sheet body 4, and the insulation region 7 is arranged around the first circuit layer 3 and the second circuit layer 5. The at least one circuit body 1 includes a plurality of circuit bodies 1 spaced apart from each other. The first circuit layers 3 of two adjacent circuit bodies 1 are separated by the insulation regions 7. The second circuit layers 5 of two adjacent circuit bodies 1 are separated by the insulation regions 7. Specifically, a colloid 71 is arranged on the insulation region 7, and the first sheet body 2 and the second sheet body 4 are connected through the colloid 71. Further, the colloid 71 is configured to reserve a gap 301 between the first circuit layer 3 and the second circuit layer 5, so that the first circuit layer 3 and the second circuit layer 5 are in selective contact. Due to the above structure, the first circuit layers 3 of two adjacent circuit bodies 1 are separated by the insulation region 7, and the second circuit layers 5 of two adjacent circuit bodies 1 are separated by the insulation region 7, so that a mis-touch phenomenon can be effectively prevented. For example, when the first circuit layer 3 of one region is pressed, the adjacent first circuit layer 3 can be prevented from being pushed, so that the mis-touch phenomenon is prevented. Furthermore, the colloid 71 is configured to reserve the gap 301 between the first circuit layer 3 and the second circuit layer 5, which further separates the first circuit layer 3 from the second circuit layer 5 to prevent the first circuit layer 3 on the first sheet body 2 from being switched on with the second circuit layer 5 in a case that the user does not click the key 8, so as to further prevent the mis-touch phenomenon.

In this embodiment, one side of the first sheet body 2 has a first inner surface 21, and the other side of the first sheet body 2 has a first outer surface 22. One side of the second sheet body 4 has a second inner surface 41 facing the first inner surface 21, and the other side of the second sheet body 4 is provided with a second outer surface 42. The first circuit layer 3 is arranged on the first inner surface 21. The second circuit layer 5 is arranged on the second inner surface 41. The insulation protruding points 6 are arranged between the first inner surface 21 and the second inner surface 41. The insulation region 7 is arranged on the first inner surface 21 and/or the second inner surface 41. The first sheet body 2 is light-transmittable, and the second sheet body 4 is light-transmittable. Specifically, the keypad structure further includes a light-transmittable key 8 arranged in a manner of facing the first outer surface. The light-transmittable key 8 includes at least one light-transmitting body 81. At least one pressing portion 82 is arranged at an edge of the light-transmitting body 81. The pressing portion 82 is located above the first circuit layer 3 and the second circuit layer 5. At least one elastic element 83 is arranged between the light-transmitting body 81 and the first outer surface. The elastic element 83 is arranged at a periphery of the pressing portion 82. Further, the at least one elastic element 83 includes a plurality of elastic elements 83. The at least one light-transmitting body 81 includes a plurality of light-transmitting bodies 81. The at least one pressing portion 82 includes a plurality of pressing portions 82. The at least one first circuit layer 3 includes a plurality of first circuit layers 3. The at least one second circuit layer 5 includes a plurality of second circuit layers 5. The plurality of elastic elements 83 are respectively arrayed between the first outer surfaces of the plurality of light-transmitting bodies 81, and are arranged at peripheries of the pressing portions 82. The plurality of pressing portions 82 are respectively arrayed above the plurality of first circuit layers 3 and the plurality of second circuit layers 5. Further, the keypad structure further includes a display device 9. The display device 9 is arranged in a manner of facing the second outer surface 42. An image displayed by the display device 9 is watched through the first sheet body 2 and the second sheet body 4 via the key 8. Due to the above structure, after the user presses the key 8, the pressing portion 82 of the key 8 pushes the first outer surface of the first sheet body 2 to push the first circuit layer 3 on the first inner surface 21 of the first sheet body 2 towards the second circuit layer 5 on the second inner surface 41 of the second sheet body 4, so that the first circuit layer 3 on the first inner surface 21 and the second circuit layer 5 on the second inner surface 41 to be in contact with each other and switched on, and a display interface of the mobile terminal is switched into a display interface or an application program of a corresponding icon displayed via the light-transmitting body 81 of the key 8. Furthermore, the elastic element 83 can drive the key 8 and the pressing portion 82 of the key 8 to be reset to relieve the pressure of the key 8 and the pressing portion 82 on the first sheet body 2, so that the insulation protruding point 6 can have a slight elastic resetting deformation to reserve the gap 301 between the first circuit layer 3 and the second circuit layer 5, thereby completing the resetting of the first circuit layer 3 and the resetting of the second circuit layer 5.

In this embodiment, the first circuit layer 3 is electroplated on the first inner surface 21 of the first sheet body 2, and the second circuit layer 5 is electroplated on the second inner surface 41 of the second sheet body 4. Both the first circuit layer 3 and the second circuit layer 5 are conductive indium tin. Due to the above structure, the conductive indium tin can be electroplated on the first inner surface 21 of the first sheet body 2 and the second inner surface 41 of the second sheet body 4, and the first inner surface 21 of the first sheet body 2 and/or the second inner surface 41 of the second sheet body 4 is/are milled to obtain the insulation region 7, so as to achieve the arrangement of the first circuit layer 3, the second circuit layer 5, and the insulation region 7. Furthermore, the conductive indium tin is a light-transmittable and transparent conductive material, so that a content displayed in the display device 9 can be displayed from the light-transmitting body 81 of the key 8 through the first sheet body 2, the second sheet body 4, the first circuit layer 3, and the second circuit layer 5, facilitating observation by the user. Specifically, in some embodiments, the first circuit layer 3 and the second circuit layer 5 can also be conductive silver paste.

In this embodiment, the second sheet body 4 is rigid. The second sheet body 4 is a light-transmittable glass sheet body. The first sheet 2 is a light-transmittable resin sheet body. The insulation protruding points 6 are resin insulation protruding points 6. Due to the above structure, a content displayed in the display device 9 can be displayed through the first sheet body 2, the second sheet body 4, and the light-transmitting body 81 of the key 8, which facilitates observation by the user. Specifically, in some embodiments, the second sheet body 4 can also be flexible.

In this embodiment, the several insulation protruding points 6 are uniformly arrayed on the second sheet body 4, and a distance between two adjacent insulation protruding points 6 is 3 mm to 6 mm. A height of each insulation protruding point 6 is at least 0.03 mm.

Embodiment II

Referring to FIG. 1 to FIG. 10, a visual programmable intelligent controller with a keypad structure, including: at least one light-transmittable key 8;

at least one key mounting shell 10 for arranging each key 8;

an elastic element 83, arranged at an edge of the key 8 and configured to allow the key 8 to move up and down in a reciprocating manner;

at least one display device 9, wherein an image displayed by the display device is watched via the key 8;

a circuit body 1, arranged between the key 8 and the display device 9 to sense an action of the key 8, wherein the circuit body 1 includes:

at least one flexible light-transmittable first sheet body 2;

at least one first circuit layer 3, wherein the first circuit layer 3 is arranged on the first sheet body 2;

at least one light-transmittable second sheet body 4;

at least one second circuit layer 5, wherein the second circuit layer 5 is arranged on the second sheet body 4; and several insulation protruding points 6, wherein the several insulation protruding points 6 are arranged between the first sheet body 2 and the second sheet body 4, and the insulation protruding points 6 are arranged around the first circuit layer 3 and the second circuit layer 5 to reserve a gap 301 between the first circuit layer 3 and the second circuit layer 5, so that the first circuit layer 3 and the second circuit layer 5 are in selective contact. The circuit body 1 that senses the action of the key 8 is in point connection to the display device 9 to form a touch-control panel. Specifically, the display device 9 at least includes an information display portion 91. Further, at least one pressing 82 is arranged at an edge of the key 8. The pressing portion 82 is located above the first circuit layer 3 and the second circuit layer 5. The elastic element 83 is located at a periphery of the pressing portion 82.

Due to the above structure, a user can press the first sheet body 2 through a key 8, so as to push the first sheet body 2 towards the second sheet body 4, and the insulation protruding points 6 have a slight elastic deformation to eliminate the gap 301 between the first circuit layer 3 and the second circuit layer 5 and cause the first circuit layer 3 and the second circuit layer 5 to be in contact with each other and switched on. The first circuit layer 3 and the second circuit layer 5 of the circuit body 1 are in contact with each other and switched on to sense whether the key 8 is clicked and triggered, so as to complete a control operation performed on the key 8. Furthermore, a content displayed by a display device 9 can be controlled through a program. For example, icons displayed by the display device 9 are controlled, and the icons displayed by the display device 9 are then matched with application programs in a terminal device such as a computer and a mobile phone. The icons displayed by the display device 9 can be observed by the user through the first sheet body 2 and the second sheet body 4 via the key 8. The user can selectively click the key 8 according to an observed icon to switch a picture displayed in a mobile terminal into a content corresponding to the icon, so as to achieve one-key control and switching of contents in live streaming pictures. Moreover, after the switching is completed, an elastic element 83 can drive the key 8 to be reset to relieve the pressure of the key 8 on the first sheet body 2, so that the insulation protruding points 6 can have a slight elastic resetting deformation to reserve the gap 301 between the first circuit layer 3 and the second circuit layer 5, completing the resetting of the key 8. Compared with a traditional key, the key 8 is pressed and reset more smoothly, has high stability, and is difficult to damage and skew. The user can quickly and smoothly complete switching of live streaming pictures and switching of application programs by using the visual programmable intelligent controller with the keypad structure. For example, the icons displayed by the display device 9 can include icons of QQ and WeChat. When the user intends to switch a live streaming picture displayed in the mobile terminal to QQ or WeChat, the user can find out the corresponding key 8 for displaying the icon of QQ or WeChat. The user clicks the key 8 for displaying the icon of QQ or WeChat to cause the key 8 for displaying the icon of QQ or WeChat to push the first sheet body 2 corresponding to the key 8, so that the insulation protruding points 6 at the first sheet body 2 corresponding to the key 8 have a slight elastic deformation to eliminate the gap 301 between the first circuit layer 3 and second circuit layer 5 corresponding to the key 8, so that the first circuit layer 3 and second circuit layer 5 corresponding to the key 8 are in contact with each other and switched on, so as to complete the control operation performed on the key 8 and switch a live streaming picture and an application program to QQ or WeChat. Furthermore, the user can also view application program pushing information through the information display portion 91. For example, the user views QQ or WeChat messages through the information display portion 91.

Figure 9:
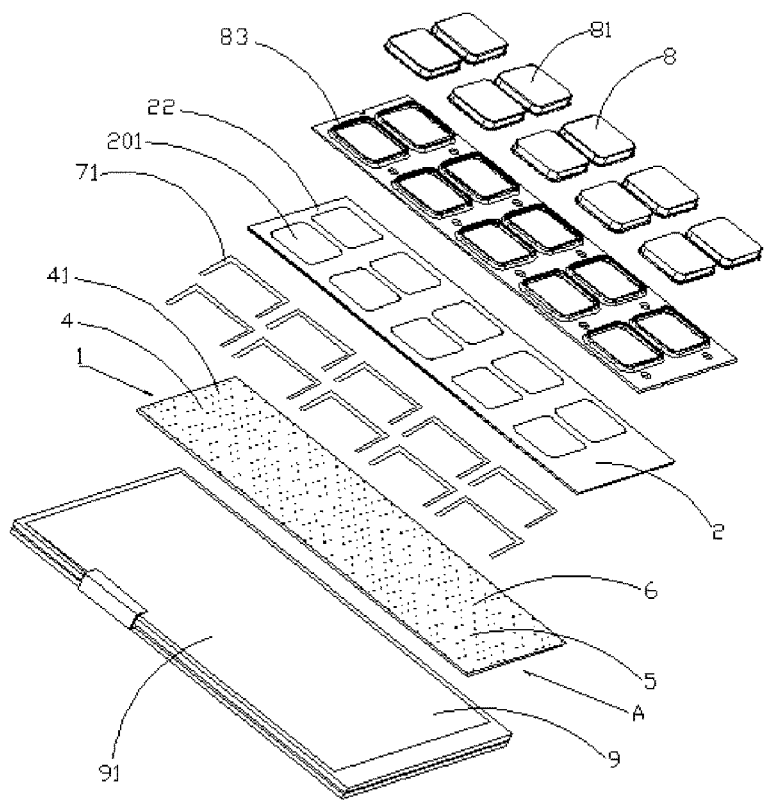
FIG. 9 is a schematic structural diagram of a first hollow portion.
Figure 10:
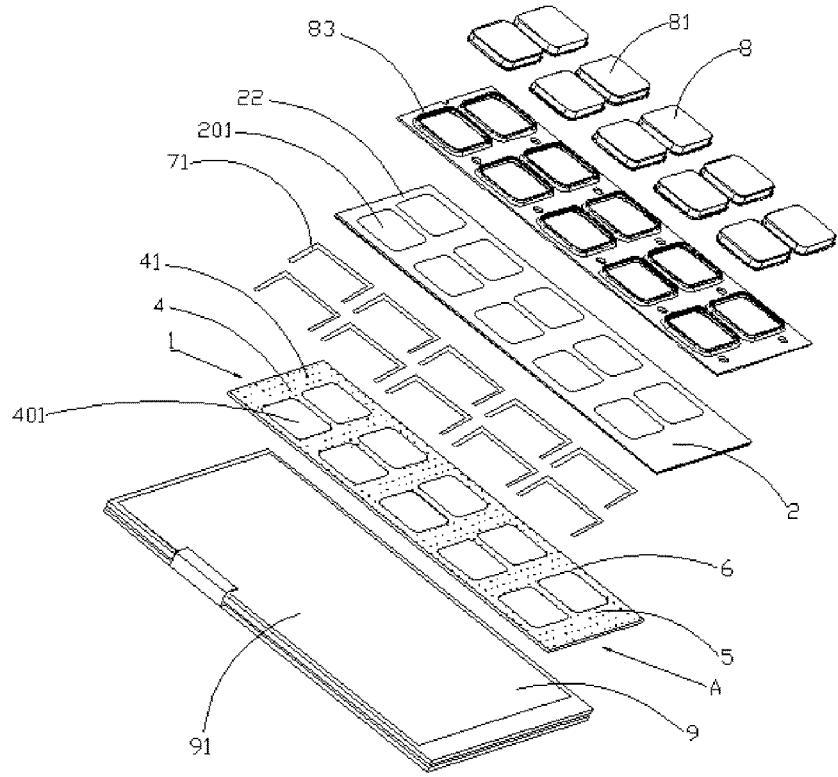
FIG. 10 is a schematic structural diagram of a first hollow portion and a second hollow portion.

With reference to FIG. 9, in some embodiments, in order to improve the definition of the content displayed in the display device 9, a first hollow portion 201 can be formed in a position, corresponding to the light-transmitting body 81 of the key 8, of the first sheet body 2, so as to prevent the first sheet body 2 from covering the content displayed in the display device 9. Further, with reference to FIG. 10, in some embodiments, a first hollow portion 401 can also be formed in a position, corresponding to the light-transmitting body 81 of the key 8, of the second sheet body 4, so as to prevent the second sheet body 4 from covering the content displayed in the display device 9.

One or more implementation modes are provided above in combination with specific contents, and it is not deemed that the specific implementation of the present disclosure is limited to these specifications. Any technical deductions or replacements approximate or similar to the method and structure of the present disclosure or made under the concept of the present disclosure shall fall within the scope of protection of the present disclosure.

What is claimed is:

1. A keypad structure, comprising at least one circuit body, wherein the circuit board comprises:
    at least one flexible first sheet body;
    at least one first circuit layer, wherein the first circuit layer is arranged on the first sheet body;
    at least one second sheet body;
    at least one second circuit layer, wherein the second circuit layer is arranged on the second sheet body; and
    several insulation protruding points, wherein the several insulation protruding points are arranged between the first sheet body and the second sheet body, and the insulation protruding points are arranged around the first circuit layer and the second circuit layer to reserve a gap between the first circuit layer and the second circuit layer, so that the first circuit layer and the second circuit layer are in selective contact.

2. The keypad structure according to claim 1, wherein at least one insulation region is arranged on the first sheet body and/or the second sheet body, and the insulation region is arranged around the first circuit layer and the second circuit layer.

3. The keypad structure according to claim 2, wherein the at least one circuit body comprises a plurality of circuit bodies spaced apart from each other; the first circuit layers of two adjacent circuit bodies are separated by the insulation region; and the second circuit layers of two adjacent circuit bodies are separated by the insulation region.

4. The keypad structure according to claim 2, wherein a colloid is arranged on the insulation region, and the first sheet body and the second sheet body are connected through the colloid.

5. The keypad structure according to claim 4, wherein the colloid is configured to reserve a gap between the first circuit layer and the second circuit layer, so that the first circuit layer and the second circuit layer are in selective contact.

6. The keypad structure according to claim 2, wherein one side of the first sheet body has a first inner surface, and the other side of the first sheet body has a first outer surface; one side of the second sheet body has a second inner surface facing the first inner surface, and the other side of the second sheet body is provided with a second outer surface; the first circuit layer is arranged on the first inner surface; the second circuit layer is arranged on the second inner surface; the insulation protruding points are arranged between the first inner surface and the second inner surface; and the insulation region is arranged on the first inner surface and/or the second inner surface.

7. The keypad structure according to claim 6, wherein the first sheet body is light-transmittable, and the second sheet body is light-transmittable.

8. The keypad structure according to claim 7, wherein the keypad structure further comprises a light-transmittable key arranged in a manner of facing the first outer surface; the light-transmittable key comprises at least one light-transmitting body; at least one pressing portion is arranged at an edge of the light-transmitting body; the pressing portion is located above the first circuit layer and the second circuit layer; at least one elastic element is arranged between the light-transmitting body and the first outer surface; and the elastic element is arranged at a periphery of the pressing portion.

9. The keypad structure according to claim 8, wherein the at least one elastic element comprises a plurality of elastic elements; the at least one light-transmitting body comprises a plurality of light-transmitting bodies; the at least one pressing portion comprises a plurality of pressing portions; the at least one first circuit layer comprises a plurality of first circuit layers; the at least one second circuit layer comprises a plurality of second circuit layers; the plurality of elastic elements are respectively arrayed between the first outer surfaces of the plurality of light-transmitting bodies, and are arranged at peripheries of the pressing portions; and the plurality of pressing portions are respectively arrayed above the plurality of first circuit layers and the plurality of second circuit layers.

10. The keypad structure according to claim 9, wherein the keypad structure further comprises a display device; the display device is arranged in a manner of facing the second outer surface; and an image displayed by the display device is watched through the first sheet body and the second sheet body via the key.

11. The keypad structure according to claim 6, wherein the first circuit layer is electroplated on the first inner surface of the first sheet body, and the second circuit layer is electroplated on the second inner surface of the second sheet body.

12. The keypad structure according to claim 1, wherein both the first circuit layer and the second circuit layer are conductive indium tin.

13. The keypad structure according to claim 1, wherein the second sheet body is rigid.

14. The keypad structure according to claim 1, wherein the second sheet body is a light-transmittable glass sheet body; the first sheet is a light-transmittable resin sheet body; and the insulation protruding points are resin insulation protruding points.

15. The keypad structure according to claim 1, wherein the several insulation protruding points are uniformly arrayed on the second sheet body, and a distance between two adjacent insulation protruding points is 3 mm to 6 mm.

16. The keypad structure according to claim 1, wherein a height of each insulation protruding point is at least 0.03 mm.

17. A visual programmable intelligent controller with a keypad structure, comprising: at least one light-transmittable key;

at least one key mounting shell for arranging each key;

an elastic element, arranged at an edge of the key and configured to allow the key to move up and down in a reciprocating manner;

at least one display device, wherein an image displayed by the display device is watched via the key;

a circuit body, arranged between the key and the display device to sense an action of the key, wherein the circuit board comprises:

at least one flexible light-transmittable first sheet body;

at least one first circuit layer, wherein the first circuit layer is arranged on the first sheet body;

at least one light-transmittable second sheet body;

at least one second circuit layer, wherein the second circuit layer is arranged on the second sheet body; and several insulation protruding points, wherein the several insulation protruding points are arranged between the first sheet body and the second sheet body, and the insulation protruding points are arranged around the first circuit layer and the second circuit layer to reserve a gap between the first circuit layer and the second circuit layer, so that the first circuit layer and the second circuit layer are in selective contact.

18. The visual programmable intelligent controller with the keypad structure according to claim 17, wherein the circuit body for sensing the action of the key is in point connection to the display device to form a touch-control panel.

19. The visual programmable intelligent controller with the keypad structure according to claim 17, wherein the display device comprises at least one information display portion.

20. The visual programmable intelligent controller with the keypad structure according to claim 17, wherein at least one pressing portion is arranged at an edge of the key; the pressing portion is located above the first circuit layer and the second circuit layer; and the elastic element is located at a periphery of the pressing portion.

\* \* \* \* \*